(12) United States Patent
Mellot

(10) Patent No.: US 11,061,137 B2
(45) Date of Patent: Jul. 13, 2021

(54) PROXIMITY DETECTION DEVICE AND METHOD COMPRISING A PULSE TRANSMISSION CIRCUIT TO TRANSMIT INTO A SCENE PLURAL OPTICAL PULSES WITH DIFFERENT PULSE DURATIONS DURING A DETECTION PERIOD

(71) Applicant: STMicroelectronics (Grenoble 2) SAS, Grenoble (FR)

(72) Inventor: Pascal Mellot, Lane en Vercors (FR)

(73) Assignee: STMicroelectronics (Grenoble 2) SAS, Grenoble (FR)

( * ) Notice: Subject to any disclaimer, the term of this patent is extended or adjusted under 35 U.S.C. 154(b) by 37 days.

(21) Appl. No.: 16/741,401

(22) Filed: Jan. 13, 2020

(65) Prior Publication Data

US 2020/0233081 A1 Jul. 23, 2020

(30) Foreign Application Priority Data

Jan. 17, 2019 (FR) ..................................... 1900424

(51) Int. Cl.
| G01S 17/04 | (2020.01) |
| G01S 7/4863 | (2020.01) |
| G01S 7/4865 | (2020.01) |
| G01S 17/10 | (2020.01) |
| H01L 31/02 | (2006.01) |
| H01L 31/107 | (2006.01) |

(52) U.S. Cl.
CPC ............ *G01S 17/04* (2020.01); *G01S 7/4863* (2013.01); *G01S 7/4865* (2013.01); *G01S 17/10* (2013.01); *H01L 31/02027* (2013.01); *H01L 31/107* (2013.01)

(58) Field of Classification Search
CPC ........ G01S 17/04; G01S 17/10; G01S 7/4865; H01L 31/02027; H01L 31/107; G01T 3/06
USPC .............................................. 250/221, 214 R
See application file for complete search history.

(56) References Cited

U.S. PATENT DOCUMENTS

| 10,021,284 B2 * | 7/2018 | Wang .................... H04N 13/128 |
| 2013/0153754 A1 | 6/2013 | Drader et al. |
| 2018/0217241 A1 | 8/2018 | Mellot |

* cited by examiner

*Primary Examiner* — Que Tan Le
(74) *Attorney, Agent, or Firm* — Seed IP Law Group LLP

(57) ABSTRACT

The present disclosure relates to a proximity detection device. The proximity detection device includes one or more photodetectors and a readout circuit configured to sample one or more output signals from the one or more photodetectors at regular intervals throughout a detection period. The proximity detection device includes a pulse transmission circuit configured to transmit into the scene a first optical pulse having a first pulse duration and a second optical pulse having a second pulse duration that is at least 50 percent longer than the first pulse duration.

20 Claims, 3 Drawing Sheets

PROXIMITY DETECTION DEVICE AND METHOD COMPRISING A PULSE TRANSMISSION CIRCUIT TO TRANSMIT INTO A SCENE PLURAL OPTICAL PULSES WITH DIFFERENT PULSE DURATIONS DURING A DETECTION PERIOD

BACKGROUND

Technical Field

The present disclosure relates generally to the field of electrical devices, and in particular to a proximity detection device and method of proximity detection.

Description of the Related Art

Proximity detection devices, also known as proximity sensors, are devices capable of detecting the presence, and/or range, of objects in their field of view. Such devices generally emit a radiation, such as infrared light, and analyze the return signal in order to evaluate the range of one or more targets.

One technology that has been proposed for implementing proximity detection devices is SPAD (single-photon avalanche diode) technology. In particular, a SPAD array can be used for a variety of applications, including for ranging, for Z or 3D gesture recognition and for 3D imaging. A proximity detection device based on a SPAD array generally comprises a light source for transmitting an optical pulse into the image scene. The light reflected back from any object in the image scene is detected by the SPAD array, and used to determine the time of flight of the optical pulse. The distance from the object to the device can then be deduced based on this time of flight.

The detection by the SPAD array of the returning optical pulse is based on event detection in the cells of the SPAD array. In particular, each cell will provide an output pulse when a photon is detected, and by monitoring the events, the arrival time of the return pulse can be estimated.

A difficulty in such an event-driven system is that under very high ambient light and/or with a very reflective and/or close target, there may be a high number of events to be captured and processed in a short time frame, leading to congestion. Furthermore, there can be difficulties in accurately determining the timing of the return pulse in view of noise and crosstalk.

BRIEF SUMMARY

According to one aspect, there is provided a proximity detection device comprising: one or more photodetectors configured to generate events in response to one or more optical pulses received from a scene; a readout circuit configured to sample one or more output signals from the one or more photodetectors at regular intervals throughout a detection period; and a pulse transmission circuit configured to transmit into the scene a first optical pulse having a first pulse duration and a second optical pulse having a second pulse duration, the pulse transmission circuit being configured such that each of the first and second optical pulses at least partially occurs during the detection period, and such that the second pulse duration is at least 50 percent longer than the first pulse duration.

According to one embodiment, the pulse transmission circuit is configured such that the second pulse duration is at least four times longer than the first pulse duration.

According to one embodiment, the pulse transmission circuit is configured such that the first pulse duration is between 100 ps and 1 ns, and the second pulse duration is between 1 and 4 ns.

According to one embodiment, the readout circuit is configured to sample the one or more output signals at time intervals of 500 ps or less throughout the detection period.

According to one embodiment, the readout circuit is configured to sample the one or more output signals during a detection period having a duration of at least twice the sum of the first and second pulse durations.

According to one embodiment, the readout circuit includes a histogram memory configured to store the samples captured throughout the detection period and to accumulate, in corresponding bins, the samples captured during sampling periods of a plurality of detection periods.

According to one embodiment, each of the one or more photodetectors is a single-photon avalanche diode.

According to one embodiment, the pulse transmission circuit is configured to generate the start of the second optical pulse a first time delay after the start of the first optical pulse, the first time delay being equal to at most half the duration of the detection period.

According to one embodiment, the pulse transmission circuit is configured to generate the start of the first optical pulse a second time delay after the start of the second optical pulse, the second time delay being equal to at least half the duration of the detection period.

According to a further aspect, there is provided a method of proximity detection comprising: transmitting into a scene, in any order, a first optical pulse having a first pulse duration and a second optical pulse having a second pulse duration; and sampling one or more output signals from one or more photodetectors at regular intervals throughout a detection period, wherein the one or more photodetectors generate events in response to one or more optical pulses received from the scene, each of the first and second optical pulses at least partially occurring during the detection period, and wherein the second pulse duration is at least 50 percent longer than the first pulse duration.

According to one embodiment, the second pulse duration is at least four times longer than the first pulse duration.

According to one embodiment, the first pulse duration is between 100 ps and 1 ns, and wherein the second pulse duration is between 1 and 4 ns.

According to one embodiment, the one or more output signals are sampled at time intervals of 500 ps or less throughout the detection period.

According to one embodiment, the one or more output signals are sampled during a detection period having a duration of at least twice the sum of the first and second pulse durations.

According to one embodiment, the method further comprises storing in a memory the samples captured throughout the detection period and accumulating, in corresponding bins of the memory, the samples captured during sampling periods of a plurality of detection periods.

BRIEF DESCRIPTION OF THE SEVERAL VIEWS OF THE DRAWINGS

The foregoing features and advantages, as well as others, will be described in detail in the following description of specific embodiments given by way of illustration and not limitation with reference to the accompanying drawings, in which.

DETAILED DESCRIPTION

Like features have been designated by like references in the various figures. In particular, the structural and/or functional features that are common among the various embodiments may have the same references and may dispose identical structural, dimensional and material properties.

For the sake of clarity, only the operations and elements that are useful for an understanding of the embodiments described herein have been illustrated and described in detail. In particular, while in the present description embodiments are described comprising a proximity detection device in the form of a SPAD array, the principles of the circuit and method described herein for proximity detection could be applied to arrays formed of other types of photodetectors that generate events based on a received optical stimulation.

Unless indicated otherwise, when reference is made to two elements connected together, this signifies a direct connection without any intermediate elements other than conductors, and when reference is made to two elements linked or coupled together, this signifies that these two elements can be connected or they can be linked or coupled via one or more other elements.

Unless specified otherwise, the expressions "around", "approximately", "substantially" and "in the order of" signify within 10%, and preferably within 5%.

Figure 1:
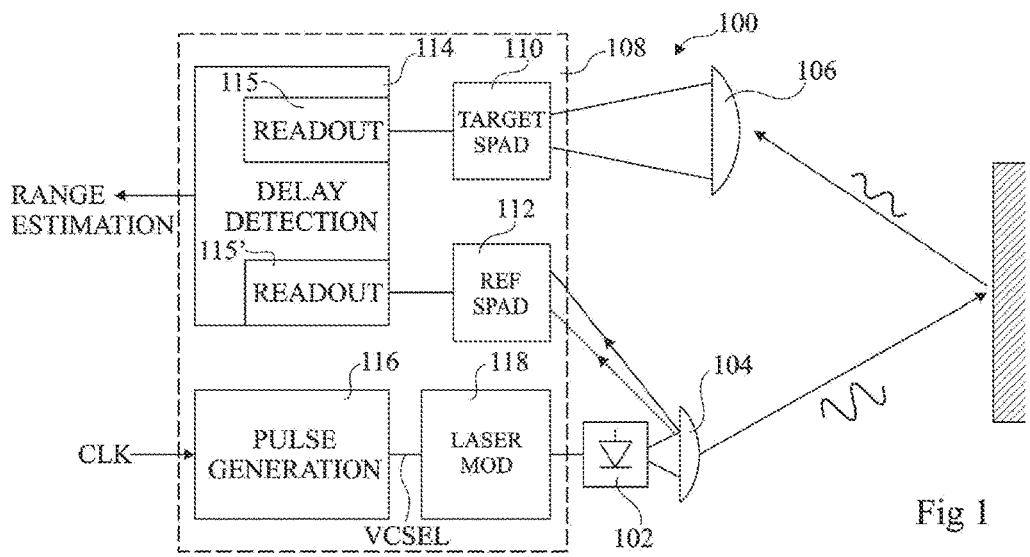
FIG. 1 schematically illustrates a proximity detection device according to an example embodiment.

FIG. 1 schematically illustrates a proximity detection device 100 implementing a ranging function according to an example embodiment. In particular, the device 100 is, for example, capable of generating a single range estimation of a target in the image scene, or of generating range estimations for various targets, for example, in the form of a 3D depth map.

The device 100 comprises a light source 102, which is, for example, a laser, for generating an optical signal, formed, for example, of a beam of optical pulses transmitted into the image scene, for example, via a lens 104. In some embodiments, the light source 102 is a vertical-cavity surface-emitting laser (VCSEL). The return optical pulses are, for example, received via a further lens 106.

The device 100 further comprises a range estimation circuit 108 for estimating the distance between the device 100 and one or more objects in the image scene against which the optical pulses reflect. The range estimation circuit 108, for example, comprises a target SPAD array (TARGET SPAD) 110, which receives the return optical pulses via the lens 106. The target SPAD array 110, for example, comprises an array of between one and several hundred SPADs. Each SPAD generates an event upon reception of one or more photons.

The range estimation circuit 108 also, for example, comprises a reference SPAD array (REF SPAD) 112, which is, for example, of the same dimensions as, or of smaller dimensions than, the target SPAD array 110, and receives an internal reflection of the transmitted optical pulses. In some embodiments, the reference SPAD array is a mono-dimensional array, for example, having only a row or column of SPAD cells.

A delay detection circuit (DELAY DETECTION) 114 is, for example, coupled to the target SPAD array 110 and to the reference SPAD array 112, and estimates the delay between each transmitted optical pulse and one or more return optical pulses received by the target SPAD array 110, in order to provide a range estimation (RANGE ESTIMATION) of the object. The delay detection circuit 114, for example, comprises a readout circuit (READOUT) 115 for storing, in the form of a histogram, the number of events captured by the target SPAD array 110. The delay detection circuit 114 may further comprise a similar readout circuit 115' for storing the number of events captured by the reference SPAD array 112. The reference SPAD array 112 and readout circuit 115' permit a differential readout to be obtained by determining the difference between the readout values. However, in some embodiments, the reference SPAD array 112 and readout circuit 115' could be omitted, depending, for example, on the desired accuracy and on what calibrations can be made in the system.

The range estimation circuit 108 also, for example, comprises a pulse generation circuit (PULSE GENERATION) 116, which generates a voltage signal VCSEL, based on a timing signal CLK. The voltage signal VCSEL is provided to a laser modulation circuit (LASER MOD) 118 for generating a voltage or current signal for driving the light source 102. An advantage of driving the light source 102 with a current rather than a voltage is that the power to current relationship is generally easier to control.

Figure 2:
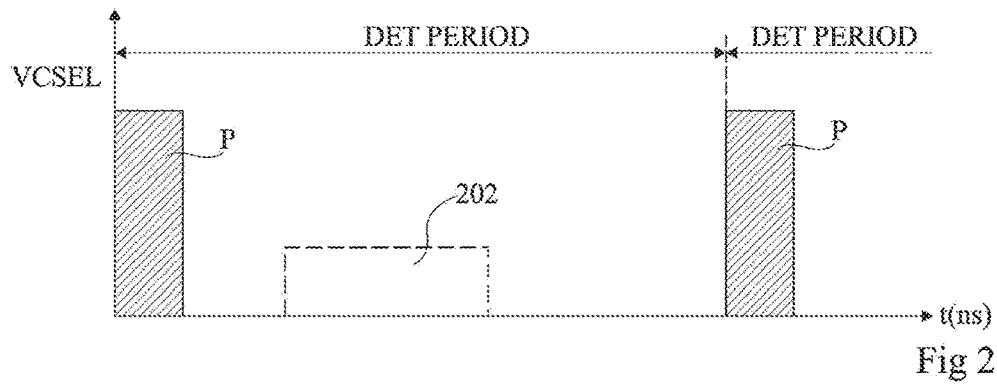
FIG. 2 is a graph illustrating an example of the timing of optical pulses according to a standard approach.

FIG. 2 is a graph illustrating an example of the signal VCSEL and represents the timing of optical pulses according to a standard approach. In particular, the x-axis corresponds to the time in nanoseconds (ns), and the y axis represents the amplitude of the signal VCSEL. Optical pulses are transmitted at intervals corresponding to a detection period (DET PERIOD). FIG. 2 illustrates an example of two consecutive pulses P transmitted at the start of consecutive detection periods. A dashed rectangle 202 in FIG. 2 represents the return pulse from the scene, this pulse generally being attenuated and spread over time with respect to the original transmitted pulse.

The present inventor has noticed that there is a tradeoff when selecting the duration of each pulse of the optical signal in view of crosstalk and signal attenuation, as will now be described in more detail with reference to FIGS. 3 to 5.

Figure 3:
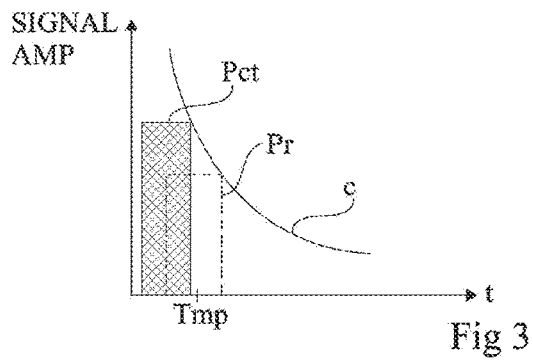
FIG. 3 is a graph representing a transmitted optical pulse and a corresponding pulse generated by crosstalk.

FIG. 3 is a graph illustrating an example of an optical pulse Pct resulting from crosstalk, represented by a curve with criss-cross shading in FIG. 3, and an optical pulse Pr corresponding to the signal received from the scene, represented by a dashed curve in FIG. 3. A curve c represents the attenuation over time, which is a function of the distance travelled by the pulses. Crosstalk in a proximity detection device corresponds to the portion of the transmitted optical pulse that is reflected back to the target SPAD array directly, without passing through the scene.

In the example of FIG. 3 the optical pulse is relatively long, and thus the pulse Pct resulting from crosstalk is also relatively long. In order to generate an estimation of the time of flight of the optical pulse, the time instant Tmp of the mid-point of the pulse Pr is generally estimated. However, overlap between the return optical pulse Pr and the crosstalk pulse Pct can lead to an imprecise range determination, as will now be described with reference to FIG. 4.

Figure 4:
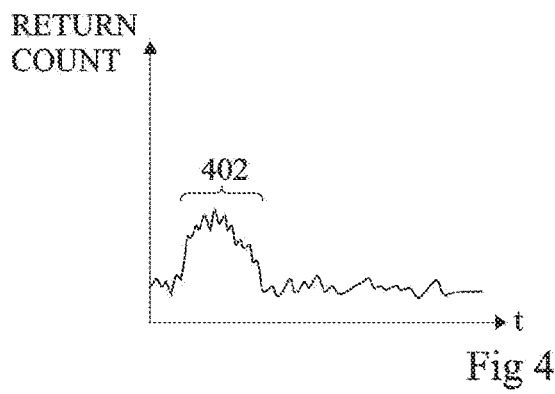
FIG. 4 is a graph representing a captured signal in the presence of crosstalk.

FIG. 4 is a graph representing the return count (RETURN COUNT), in other words the number of events, captured by a proximity detection device in the presence of crosstalk, based on the example of the received optical pulses of FIG. 3. It can be seen that the overlap between the crosstalk pulse Pct and the optical pulse Pr from the image scene leads to a captured pulse 402 having a dissymmetrical shape. It is very difficult to extract from such a deformed pulse an accurate estimation of the timing of the midpoint Tmp of the received optical pulse Pr, not least because it does not have a uniform amplitude.

Figure 5:
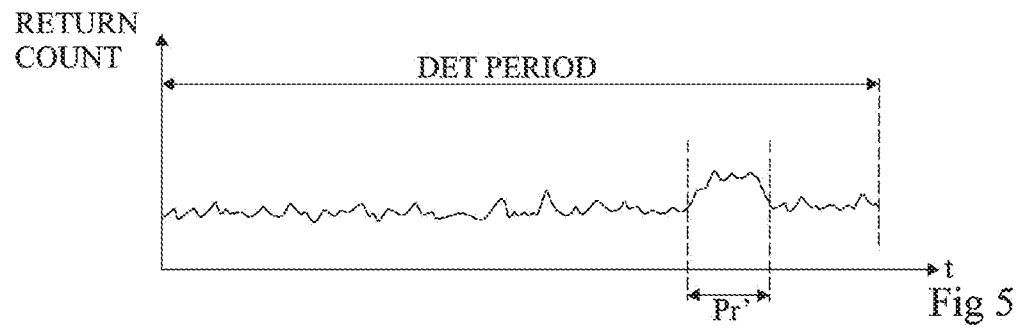
FIG. 5 is a graph representing a return optical pulse having a relatively low signal-to-noise ratio (SNR)

FIG. 5 is a graph representing an example of a signal captured by a proximity detection device during a detection period DET PERIOD. In the case of a relatively short optical pulse, the energy contained in such a pulse will be relatively low. This can lead to a weak return pulse Pr', and in particular a signal having a relatively low signal-to-noise ratio (SNR).

Thus the present inventor has found that, in known proximity detection devices, there is generally a compromise to be made between transmitting relatively short optical pulses, and reducing the risk of imprecision due to crosstalk, and transmitting relatively long optical pulses and ensuring a relatively high SNR.

Figure 6:
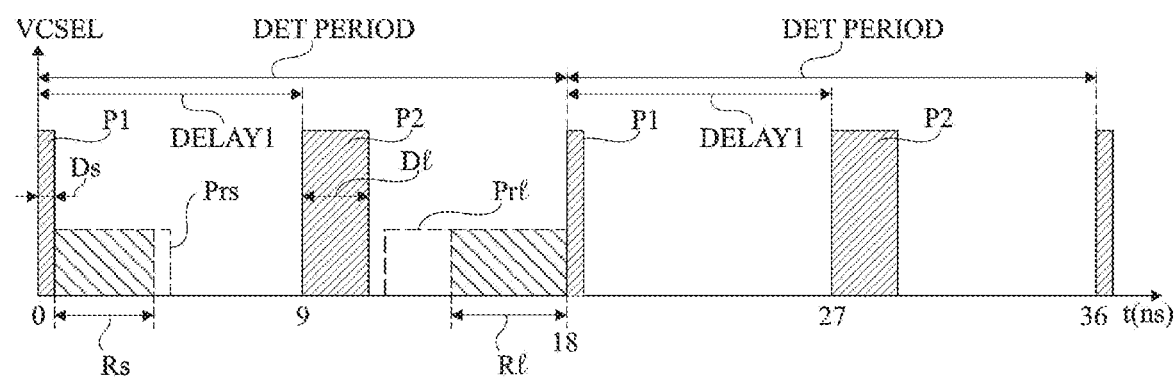
FIG. 6 is a graph illustrating the timing of optical pulses according to an example embodiment of the present disclosure.

FIG. 6 is a graph illustrating the timing of optical pulses according to an example embodiment of the present disclosure, and in particular the form of the signal VCSEL that is used to generate the optical pulses.

According to embodiments described herein, optical pulses having at least two different durations are transmitted to the scene by the proximity detection device. For example, the pulse generation circuit 116 is configured to generate the signal VCSEL as represented in FIG. 6 such that the optical signal has optical pulses of similar form.

As shown in FIG. 6, each of the pulses during a same detection period (DET PERIOD) at least partially occurs during that detection period. As mentioned above, a detection period corresponds to a period during which the output signals from the photodetectors of the proximity detection device are sampled at regular intervals in order to generate a histogram that can be used for range estimation. In one embodiment, the readout circuit 115 is configured to sample the one or more output signals at time intervals of 500 picoseconds (ps) or less throughout the detection period.

In the example of FIG. 6, a pulse P1 occurs at the start of each detection period, and has a relatively short pulse duration Ds. A second pulse P2 occurs at approximately halfway through the detection period, and has a relatively long pulse duration D1. For example, the pulse duration D1 is at least 50 percent longer than the pulse duration Ds, and in some embodiments is at least four times as long as the pulse duration Ds. Furthermore, in some embodiments, the pulse duration Ds is between 100 ps and 1 ns, and pulse duration D1 is between 1 and 4 ns.

In some embodiments, the detection period has a duration of at least twice the sum of the pulse durations Ds and D1. In some embodiments the duration of the detection period is between 10 and 50 ns, although other values would be possible depending, for example, on the duration of the long and short pulses.

The delay between the start of the pulse P1 and the start of the pulse P2 in each detection period, labelled DELAY1 in FIG. 6, is, for example, at most 50 percent of the duration of the detection period in the case that the pulse P1 is shorter than the pulse P2. In some embodiments, this delay is equal to less than 50 percent of the duration of the detection period, for example, to 40 percent or less of the duration of the detection period, thereby providing a longer time duration and thus a greater distance detection capability using the relatively long pulse.

In alterative embodiments, the order of pulses P1 and P2 in each detection period could be reversed, the pulse P2 occurring at the start of each detection period. In such a case, the delay between the start of the pulse P2 and the start of the pulse P1 in each detection period is, for example, equal to at least 50 percent of the duration of the detection period. In some embodiments, this delay is equal to more than 50 percent of the duration of the detection period, for example, at least 60 percent of the duration of the detection period, thereby providing a longer time duration and thus a greater distance detection using the relatively long pulse.

It will be apparent to those skilled in the art that while an example has been illustrated in FIG. 6 in which the start of the first pulse in each detection period (the pulse P1 in FIG. 6) coincides with the start of the detection period, in alternative embodiments, different timing would be possible. For example, this first pulse could start after the start of the detection period, or the detection period could start after the start of the first pulse, depending on the ranges that are desired to be captured by the proximity detection device.

FIG. 6 also illustrates dashed rectangles Prs and Prl representing examples of the forms of the return pulses from the scene in response to the pulses P1 and P2 respectively. The pulse P1, for example, permits a mid-point of the return pulse Prs to be detected in a time range Rs represented by a shaded zone in the return pulse Prs. In some embodiments, this time range Rs corresponds to a time of flight of between 0 and 2.5 ns, corresponding to a captured object range of between 0 and 37.5 cm. Similarly, the pulse P2, for example, permits a mid-point of the return pulse to be detected in a time range R1 represented by a shaded zone in the return pulse Prl. In some embodiments, this time range R1 corresponds to a time of flight of between 2.5 and 9 ns, corresponding to a captured object range of between 37.5 and 135 cm. Of course, the distance ranges targeted by the pulses P1 and P2 will depend on the particular use of the proximity detection device.

Figure 7:
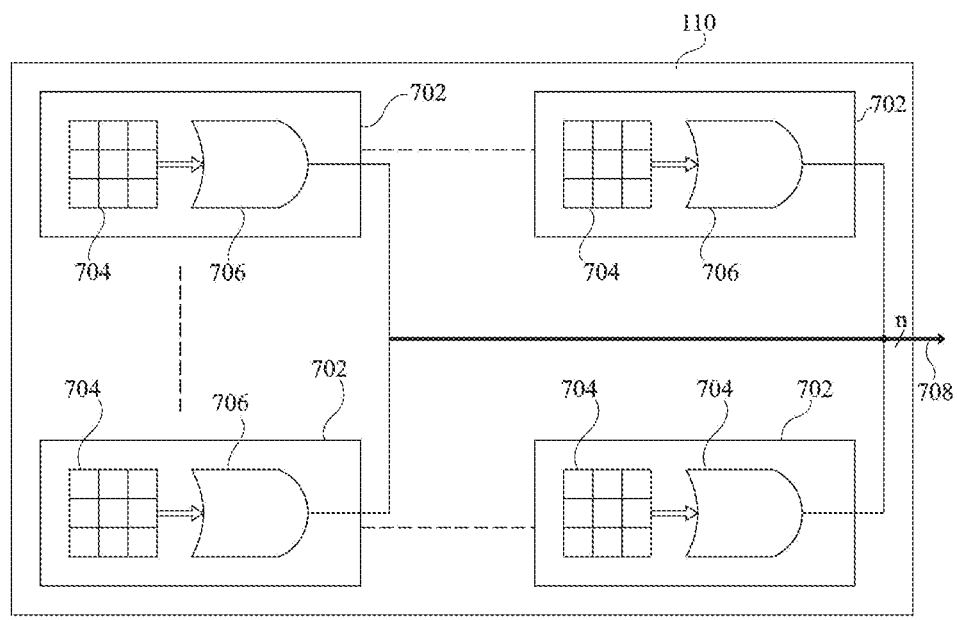
FIG. 7 schematically illustrates a SPAD array according to an example embodiment of the present disclosure.

FIG. 7 schematically illustrates the target SPAD array 110 of FIG. 1 in more detail according to an example embodiment. The SPAD array 110 is, for example, formed of an array of cells 702, each cell comprising a sub-array 704 of SPADs and an OR tree 706 for capturing events generated by the sub-array 704. In the example of FIG. 7, each sub-array 704 corresponds to an arrangement of nine SPADs in a three-by-three block, although a different number and arrangement of SPADs would be possible. The output lines of the OR trees of the cells 702, for example, together form n output lines 708 of the SPAD array 110, where n is equal to the number of cells 702. In one example, n is equal to between 1 and several hundred.

Figure 8:
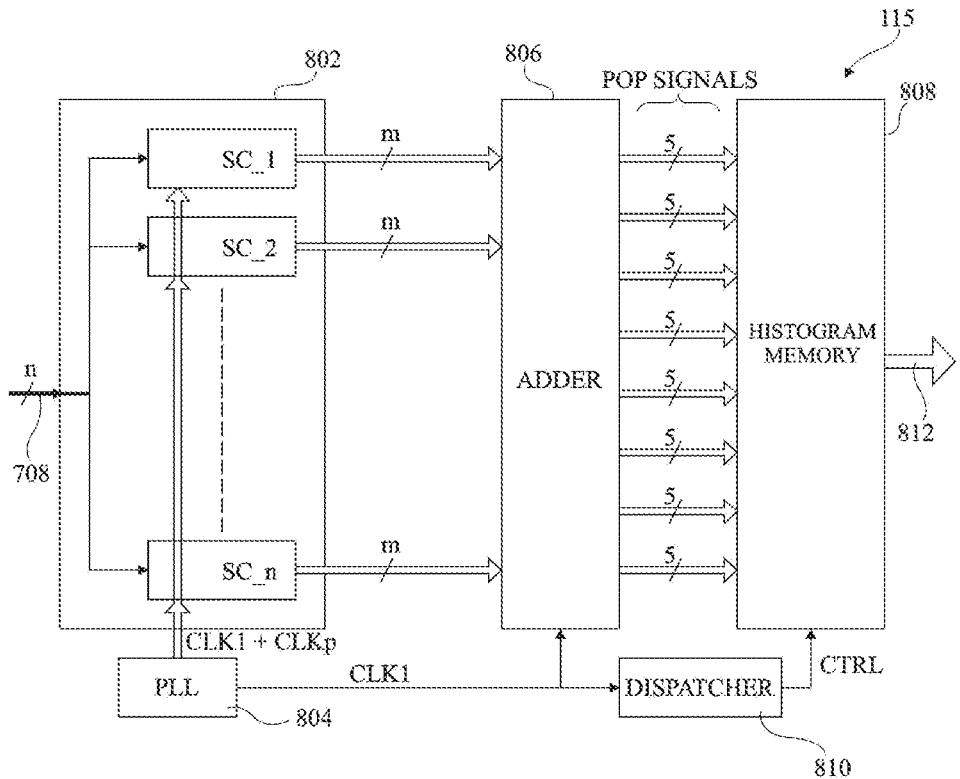
FIG. 8 schematically illustrates a readout circuit for the SPAD array of FIG. 7 according to an example embodiment.

FIG. 8 schematically illustrates the readout circuit 115 of FIG. 1 in more detail according to an example embodiment. The readout circuit 115' is, for example, implemented by a similar circuit coupled to the output of the reference SPAD array 112. The n output lines 708 from the SPAD array 110 are, for example, respectively coupled to n sampling circuits SC_1 to SC_n of a sampling block 802. Each of these sampling circuits, for example, receives a series of p clock signals CLK1 to CLKp generated by a phase locked loop (PLL) 804. Each of these clock signals, for example, has a frequency of approximately 1 GHz. The p clock signals CLK1 to CLKp are, for example, phase shifted with respect to each other such that they have significant edges at intervals throughout a sub-period of the detection period. For example, calling the sampling period SP, the sub-period has a duration of pxSP ps. In some embodiments, the sampling period SP is equal to 125 ps, in other words each sampling circuit SC_1 to SC_n generates samples at intervals of 125 ps. More generally, the sampling period SP could be between 50 and 500 ps, and the clock signals CLK1 to CLKp could each have a frequency in the range 100 kHz to 5 GHz.

Each of the sampling circuits SC_1 to SC_n, for example, generates an m-bit output signal, where m is, for example, equal to between 4 and 16, and, for example, to 8. These signals are provided to an adder (ADDER) 806, which is, for example, clocked by the clock signal CLK1 from the PLL 804 and, for example, performs bit to bit addition of the m-bit signals from all of the sampling circuits SC_1 to SC_n at each sampling instant in order to generate p output signals (p OP SIGNALS), where p is equal to 8 in the example of FIG. 8. In the example of FIG. 8, each of the p values is a 5-bit value, although different bit lengths would be possible. These values provide p consecutive samples, which are stored in a histogram memory (HISTOGRAM MEMORY) 808. The detection period is, for example, formed by a number q of consecutive sets of p samples. For example, in one embodiment, each set of p samples corresponds to 8 samples at 125 ps intervals, corresponding to a duration of 1 ns. The detection period, for example, corresponds to 18 consecutive groups of p samples, and is thus equal to 18 ns in duration. Of course, other values of p and q would be possible.

A dispatcher (DISPATCHER) 810, for example, provides a control signal CTRL to the histogram memory 808 in order to control the storage of the samples in q blocks of the memory, such that the memory can output, on an output bus 812, pxq samples corresponding to an entire detection period. In one example, this output bus provides 144 bins (i.e., p=8 and q=18), each of 21 bits. For example, the detection sequence of each detection period is repeated thousands of times, and the corresponding events are accumulated in the histogram memory 808. Assuming a case in which, during each detection period, each bin receives a maximum count of 16, by accumulating the counts over 65536 detection periods, an output signal of 21 bits can be reached.

As will be apparent to those skilled in the art, the samples stored in the histogram memory 808 representing the detection periods can be processed in order to exact the timing of one or more return pulses and thus detect one or more object ranges in the scene.

Figure 9:
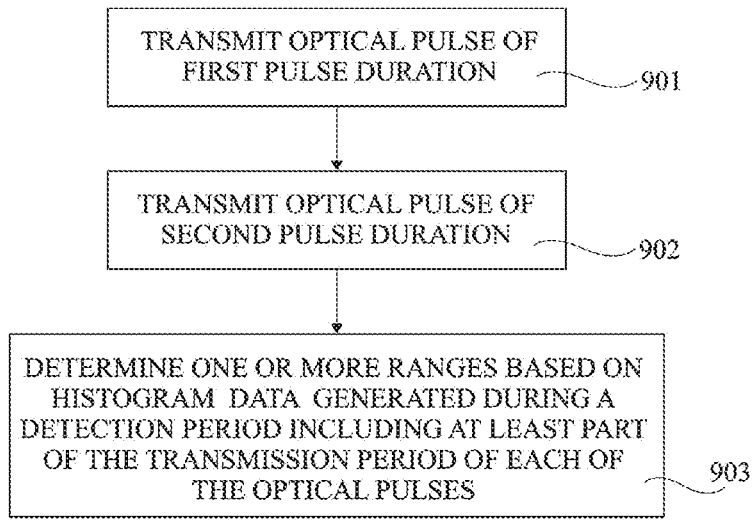
FIG. 9 is a flow diagram illustrating an example of operations in a method of proximity detection according to an example embodiment.

FIG. 9 is a flow diagram illustrating an example of operations in a method of proximity detection according to an example embodiment. These operations are, for example, performed by the circuit elements 116, 118, 102 and 115 of the proximity detection device 100 of FIG. 1.

In an operation 901, a first optical pulse having a first pulse duration is transmitted into a scene by the circuit elements 116, 118 and 102.

In an operation 902, a second optical pulse having a second pulse duration is transmitted into a scene by the circuit elements 116, 118 and 102. As explained above, the second pulse duration is, for example, at least 50 percent longer than the first pulse duration. The order of the operations 901 and 902 could be reversed.

In an operation 903, one or more ranges are determined based on histogram data generated by sampling, using the readout circuit 115, one or more output signals from one or more photodetectors of the proximity detection device at regular intervals throughout a detection period, and in some embodiments, for a plurality of detection periods. This detection period includes at least part of the transmission period of the first optical pulse and at least part of the transmission period of the second optical pulse. In practice, each detection period being continuous, at least the second optical pulse will occur entirely during the detection period.

An advantage of the embodiments described herein is that, by using optical pulses of different pulse durations during each detection period, objects at both relatively short and relatively long ranges can be detected with good precision. In particular, the relatively short optical pulses permit objects at relatively short ranges to be detected with relatively little crosstalk interference, while the relatively long optical pulses permit objects at relatively long ranges to be detected while maintaining a good signal to noise ratio.

Various embodiments and variants have been described. Those skilled in the art will understand that certain features of these embodiments can be combined and other variants will readily occur to those skilled in the art. In particular, while examples of the SPAD array and of the readout circuit have been described with reference to FIGS. 7 and 8, these circuits represent merely one example implementation, and many variations would be possible. For example, in some embodiments a 3D depth map could be generated by processing the output signals from each of the cells 702 of the SPAD array individually, rather than combining the samples using the adder 806 of FIG. 8.

Furthermore, while examples have been described in which there are two optical pulses transmitted during each detection period, in alternative embodiments three or more optical pulses of different pulse durations could be transmitted during each detection period.

Furthermore, rather than being implemented by SPAD devices, the photodetectors described herein could be implemented by APDs (Avalanche Photodiodes), and the photodetector array could be implemented by SiPMs (Silicon Photon Multipliers) corresponding to arrays of APDs. For example, the SiPMs could be coupled with a relatively fast analog readout circuit and an ADC in order to produce histograms similar to those obtained by the SPAD array. An advantage of using a SPAD array is that this allows fully digital implementation techniques to be used.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A proximity detection device, comprising:
   one or more photodetectors configured to:
      receive one or more optical pulses reflected from a scene; and
      output one or more output signals based on the one or more optical pulses;
   a readout circuit configured to sample the one or more output signals at regular intervals throughout a detection period; and
   a pulse transmission circuit configured to:
      transmit into the scene a first optical pulse having a first pulse duration; and
      transmit into the scene a second optical pulse having a second pulse duration that is at least 50 percent longer than the first pulse duration, wherein the pulse transmission circuit is configured to transmit the first and second optical pulses at least partially during the detection period.

2. The proximity detection device of claim 1, wherein the pulse transmission circuit is configured to transmit the second optical pulse having the second pulse duration that is at least four times longer than the first pulse duration.

3. The proximity detection device of claim 2, wherein the first pulse duration is between 100 picoseconds (ps) and 1 nanosecond (ns), and the second pulse duration is between 1 and 4 ns.

4. The proximity detection device of claim 1, wherein the readout circuit is configured to sample the one or more output signals at time intervals of 500 ps or less throughout the detection period.

5. The proximity detection device of claim 1, wherein the readout circuit is configured to sample the one or more output signals during the detection period having a duration of at least twice a sum of the first and second pulse durations.

6. The proximity detection device of claim 1, wherein the readout circuit includes a memory configured to store samples of the one or more output signals captured throughout the detection period and to accumulate, in corresponding bins, corresponding samples captured during respective sampling periods of a plurality of detection periods.

7. The proximity detection device of claim 1, wherein each of the one or more photodetectors is a single-photon avalanche diode.

8. The proximity detection device of claim 1, wherein the pulse transmission circuit is configured to begin transmitting the second optical pulse a first time delay after beginning transmitting the first optical pulse, wherein the first time delay is at most half of the detection period.

9. The proximity detection device of claim 1, wherein the pulse transmission circuit is configured to begin transmitting the first optical pulse a second time delay after beginning transmitting the second optical pulse, wherein the second time delay is at least half of the detection period.

10. A method of proximity detection, comprising:
    transmitting, into a scene, a first optical pulse having a first pulse duration and a second optical pulse having a second pulse duration that is at least 50 percent longer than the first pulse duration;
    receiving, by one or more photodetectors, optical signals reflected by the scene and outputting, by one or more photodetectors, one or more output signals based on the optical signals; and
    sampling the one or more output signals at regular intervals throughout a detection period, wherein each of the first and second optical pulses are at least partially transmitted during the detection period.

11. The method of claim 10, wherein the second pulse duration is at least four times longer than the first pulse duration.

12. The method of claim 11, wherein the first pulse duration is between 100 picoseconds (ps) and 1 nanoseconds (ns), and wherein the second pulse duration is between 1 and 4 ns.

13. The method of claim 10, wherein the one or more output signals are sampled at time intervals of 500 ps or less throughout the detection period.

14. The method of claim 10, wherein a duration of the detection period is at least twice a sum of the first and second pulse durations.

15. The method of claim 10, further comprising:
    storing, in a memory, samples of the one or more output signals captured throughout the detection period and accumulating, in corresponding bins of the memory, corresponding samples captured during respective sampling periods of a plurality of detection periods.

16. The method of claim 10, wherein each of the one or more photodetectors is a single-photon avalanche diode.

17. A proximity detection device, comprising:
    a single-photon avalanche diode (SPAD) array configured to:
       receive one or more optical pulses reflected from a scene; and
       output one or more output signals based on the one or more optical pulses;
    a readout circuit configured to sample the one or more output signals at regular intervals throughout a detection period;
    a pulse transmission circuit configured to:
       transmit into the scene a first optical pulse having a first pulse duration; and
       transmit into the scene a second optical pulse having a second pulse duration that is at least 50 percent longer than the first pulse duration, wherein the pulse transmission circuit is configured to transmit the first and second optical pulses at least partially during the detection period; and
    a pulse generator configured to generate a signal based on a clock signal and output the signal to drive the pulse transmission circuit.

18. The proximity detection device of claim 17, wherein the pulse transmission circuit is configured to transmit the second optical pulse having the second pulse duration that is at least four times longer than the first pulse duration.

19. The proximity detection device of claim 18, wherein the first pulse duration is between 100 picoseconds (ps) and 1 nanosecond (ns), and the second pulse duration is between 1 and 4 ns.

20. The proximity detection device of claim 17, wherein the readout circuit is configured to sample the one or more output signals at time intervals of 500 ps or less throughout the detection period.

* * * * *